United States Patent [19]
Hoshino

[11] Patent Number: 5,922,180
[45] Date of Patent: Jul. 13, 1999

[54] SPUTTERING APPARATUS FOR FORMING A CONDUCTIVE FILM IN A CONTACT HOLE OF A HIGH ASPECT RATIO

[75] Inventor: Akira Hoshino, Tokyo, Japan

[73] Assignee: NEC Corporation, Tokyo, Japan

[21] Appl. No.: 08/759,777

[22] Filed: Dec. 3, 1996

[30] Foreign Application Priority Data

Dec. 4, 1995 [JP] Japan ..................................... 7-315031

[51] Int. Cl.⁶ .......................... C23C 14/34; C23C 14/42; C23C 14/44
[52] U.S. Cl. ................... 204/298.06; 204/298.11; 204/298.08; 204/298.14; 204/298.15; 204/192.12
[58] Field of Search ........................ 204/298.11, 298.19, 204/298.08, 298.14, 298.15, 192.12, 298.06, 298.02, 298.04

[56] References Cited

U.S. PATENT DOCUMENTS

| 4,997,539 | 3/1991 | Komizo et al. | 204/298.06 |
|---|---|---|---|
| 5,110,435 | 5/1992 | Haberland | 204/192.12 |
| 5,480,527 | 1/1996 | Welty | 204/298.03 |
| 5,492,606 | 2/1996 | Stauder et al. | 204/192.12 |
| 5,584,974 | 12/1996 | Sellers | 204/298.08 |

FOREIGN PATENT DOCUMENTS

| 63-76871 | 4/1988 | Japan . |
|---|---|---|
| 2-141572 | 5/1990 | Japan . |
| 3-1810 | 1/1991 | Japan . |
| 5-287518 | 11/1993 | Japan . |

*Primary Examiner*—Nam Nguyen
*Assistant Examiner*—Gregg Cantelmo
*Attorney, Agent, or Firm*—Young & Thompson

[57] ABSTRACT

A sputtering apparatus contains a sputtering reaction chamber. A target is provided in the sputtering reaction chamber. A shielding plate is provided in the vicinity of the target. An emitter is electrically connected to the shielding plate for causing ionized sputter-particles and neutral sputter-particles to be emitted from the target and dropped at various angles into an under-space positioned under the target and in the sputtering reaction chamber. A substrate holder is provided in the sputtering reaction chamber. The substrate holder is laterally distanced from the under-space for holding a substrate so that a surface of the substrate is vertical. A generator is provided for generating a static field in a lateral direction to be applied across a laterally extending space which includes the substrate holder and the under-space so that the static field does laterally accelerate only the ionized sputter-particles toward the substrate held by the substrate holder for a lateral deposition of the ionized sputter-particles onto the surface of the substrate.

25 Claims, 4 Drawing Sheets

FIG. 9A ← Motion of Ions under a Positive Pulse Voltage
←--- Motion of Ions under a Negative Pulse Voltage

SPUTTERING APPARATUS FOR FORMING A CONDUCTIVE FILM IN A CONTACT HOLE OF A HIGH ASPECT RATIO

BACKGROUND OF THE INVENTION

1. Field of the Invention

The present invention relates to a sputtering apparatus, and more particularly to a sputtering apparatus for forming a conductive film in a contact hole of a high aspect ratio.

2. Description of the Related Art

A sputtering method had been used for depositing a conductive film for forming an interconnection between elements provided over a semiconductor substrate.

In recent year, as the scaling down of the semiconductor integrated circuits has been promoted, an aspect ratio of contact holes extending between impurity diffusion layers and interconnections and between interconnections is also required to be high wherein the aspect ratio is defined as a ratio of a hole depth to a hole diameter. The contact holes of the high aspect ratio have vertical side walls which form large steps vertical to a surface of the semiconductor device.

A typical parallel plate type sputtering apparatus will be described with reference to FIG. 1. In a sputtering reaction chamber 1a, a target 1 is placed and a shield 2 is further provided around the target 1 so that the shield 2 partially surrounds the target 1 and is spaced from the target 1. The target 1 is connected to a direct current power supply 9 so that a negative voltage is applied to the target 1 whereby the target 1 has a minus potential. The shield 2 surrounding the target 1 is grounded so that the shield 2 has the ground potential. A substrate 4 is placed in the sputtering reaction chamber 1a so that the substrate 4 faces to the target 1. The target 1 is sputtered and neutral sputtering particles 6 are emitted from the target 1 at various angles.

With reference to FIG. 2, a silicon oxide film 101 is formed over a silicon substrate 100. The silicon oxide film 101 is formed with a contact hole 104. A conductive film 102 is entirely deposited over the substrate 100 provided with the contact hole 104 by use of the parallel plate type sputtering apparatus as illustrated in FIG. 1, wherein the contact hole 104 has a high aspect ratio. As a result of the deposition of the conductive film 102 by use of the parallel plate type sputtering apparatus, an overhand growth of the conductive film 102 appears at the contact hole step shoulder. Namely, overhanging portions 103 extend laterally to the center of the contact hole 104 from the top conductive film portion overlying the silicon substrate 100 as illustrated in FIG. 2. The formation of the overhanging portion 103 of the conductive film 102 causes the shadow effects due to which the lower portion of the conductive film 102 is much thinner than that of the upper portion of the conductive film 102.

As many sputtering particles are incident at a relatively large oblique angle from the vertical direction to the surface of the silicon substrate 100, the overhanging portion 103 of the conductive film 102 is remarkable. If the lower portion of the conductive film 102 in the contact hole 104 has an insufficient thickness, it is difficult to obtain a good electrical connection in the contact hole, resulting in a drop of the yield of the semiconductor device and also in a reduction of the reliability of the semiconductor device.

In order to settle the above problems, a bias sputtering method was proposed. The bias sputtering method will be described with reference to FIG. 3. In a sputtering reaction chamber 1a, a target 1 is placed and a shield 2 is further provided around the target 1 so that the shield 2 partially surrounds the target 1 and is spaced from the target 1. The target 1 is connected to a direct current power supply 9 so that a negative voltage is applied to the target 1 whereby the target 1 has a minus potential. The shield 2 surrounding the target 1 is grounded so that the shield 2 has the ground potential. A substrate 4 is placed in the sputtering reaction chamber 1a so that the substrate 4 faces the target 1. A magnet is provided outside the sputtering reaction chamber and over the top wall of the chamber. The target 1 is subjected to sputtering and neutral sputtering particles 6 are sputtered from the target 1 at various angles. The silicon substrate 4 is also electrically connected to the direct current power supply 9 so that the silicon substrate 4 is applied with the negative voltage. Namely, the silicon substrate 1 has a minus potential for the purpose of simultaneous formation of the conductive film and sputter-etching.

As illustrated in FIG. 4A, the sputter-etching suppresses formation of any large overhanging portion of the conductive film 102 but allows formation of a small overhanging portion 103. Since as described above the sputter-etching suppresses the overhanging growth of the conductive film 102 which causes the shadow effects, the use of the sputter-etching method allows an efficient formation of the conductive film not only the upper portion of the contact hole but also lower portion of the contact hole.

Another sputtering method for suppressing the overhanging growth of the conductive film is the collimator sputtering method which is disclosed in the Japanese laid-open patent publication No. 5-299375. This collimator sputtering method will be described with reference to FIG. 5. In a sputtering reaction chamber, a target 1 is placed and a shield 2 is further provided around the target 1 so that the shield 2 partially surrounds the target 1 and is spaced from the target 1. The target 1 is connected to a direct current power supply 9 so that a negative voltage is applied to the target 1 whereby the target 1 has a minus potential. The shield 2 surrounding the target 1 is grounded so that the shield 2 has the ground potential. A substrate 4 is placed in the sputtering reaction chamber so that the substrate 4 faces to the target 1. The substrate 4 is electrically grounded. The magnet 8 is provided outside the sputtering reaction chamber and over the top wall of the chamber. The target 1 is sputtered and neutral sputtering particles 6 are emitted from the target 1 at various angles. Collimator 10 is provided between the target 1 and the substrate 4 so that the collimator 10 is spaced apart from both the target 1 and the substrate 4. As described above, the target 1 is subjected to the sputtering and sputtering particles are sputtered from the target 1 at various angles oblique from the vertical direction to the surface of the substrate 4. The sputtered particles were sputtered from the target 1 and enter into the collimator 10. At this time, the collimator 10 catches the sputtered particle having a large oblique angle from the vertical direction to the surface of the substrate 4 but allows passage of only the sputtered particle having zero or very small oblique angle from the vertical direction to the surface of the substrate 4. As a result, the sputtered particles to be deposited over the substrate has just or almost vertical direction, for which reason as illustrated in FIGS. 6A and 6B, slight overgrowth of the conductive film appears at the contact hole step shoulder.

With reference to FIG. 6A, a silicon oxide film 101 is formed over the silicon substrate 100. The silicon oxide film 101 is formed with a contact hole 104. The sputtered particles having passed through the collimator 10 of FIG. 5 have just vertical or almost vertical direction, for which reason only a slight overhanging portion 103 of the conductive film 102 is formed at the contact hole step shoulder whereby it is possible to deposit the conductive film at the lower portion of the contact hole even if the contact hole has a high aspect ratio. Since the remarkable formation of the overhanging portion 103 of the conductive film is prevented by the collimator, it is also possible to prevent the shadow effect which is caused by the overhanging growth of the conductive film.

Recently the diameter of the contact hole in the semiconductor integrated circuit has a size of 0.5 micrometers and the thickness of the silicon oxide film in which the contact hole is formed is 2.0 micrometers. Since the depth of the contact hole is defined by the thickness of the silicon oxide film, the aspect ratio of the contact hole is about 4. As illustrated in FIG. 4B, if the bias sputtering method is used for deposition of the conductive film in the contact hole of such higher aspect ratio, the thickness of the conductive film at the lower portion of the contact hole is so thin as when the parallel plate type sputtering apparatus is used. This phenomenon was reported by Mogami et al. in Proceeding Second International IEEE VLSI Multilevel Interconnection Conference, pp. 17–23, 1985.

The collimator sputtering method also has the same problem as described above. Even if the collimator is used, however, some sputtered particles have various oblique angles from the vertical direction to the surface of the substrate. Namely, there are some sputtered particles to be incident in the oblique angles into the contact hole of such high aspect ratio, for which reason a certain overhanging portion 103 of the conductive film 102 is formed at the contact hole step shoulder. The overhanging portion 103 of the conductive film 102 causes the shadow effect due to which the very thin conductive film is deposited on the lower portion of the contact hole of such higher aspect ratio as illustrated in FIG. 6B.

To order to solve the above problem, it was proposed to raise the aspect ratio of the collimator so as to allow only the sputtered particles just vertical to the surface of the substrate to pass through them to be deposited over the substrate. Actually, however, most of the sputtered particles have various oblique angles from the vertical direction to the surface of the substrate, for which reason only a small amount of the sputtered particles can pass through the collimator to be deposited over the substrate, resulting in a reduction in deposition rate or growth rate of the conductive film.

In the above circumstances, it was required to provide a novel sputtering apparatus adopted for uniform deposition of a conductive film in a contact hole of very high aspect ratio without reduction in deposition rate or growth rate of the conductive film.

SUMMARY OF THE INVENTION

Accordingly, it is an object of the present invention to provide a sputtering apparatus adopted for uniform deposition of a conductive film in a contact hole of very high aspect ratio without reduction in deposition rate or growth rate of the conductive film.

The above and other objects, features and advantages of the present invention will be apparent from the following descriptions.

The present invention also provides a sputtering apparatus comprising a sputtering reaction chamber. A target is provided in the sputtering reaction chamber. A shielding plate is provided in the vicinity of the target. An emitter is electrically connected to the shielding plate for causing ionized sputter-particles and neutral sputter-particles to be emitted from the target and dropped at various angles into an under-space positioned under the target and in the sputtering reaction chamber. A substrate holder is provided in the sputtering reaction chamber. The substrate holder is laterally distanced from the under-space for holding a substrate so that a surface of the substrate is vertical. A generator is provided for generating a static field in a lateral direction to be applied across a laterally extending space which includes the substrate holder and the under-space so that the static field does laterally accelerate only the ionized sputter-particles toward the substrate held by the substrate holder for a lateral deposition of the ionized sputter-particles onto the surface of the substrate.

BRIEF DESCRIPTION OF THE DRAWINGS

Preferred embodiments of the present invention will be described in detail with reference to the accompanying drawings.

FIG. 9A is a diagram illustrative of potential of ionized sputtering particles both when positive and negative pulse voltages are applied between a target and a shield plate in a novel sputtering apparatus in accordance with the present invention.

DESCRIPTION OF THE PREFERRED EMBODIMENT

Figure 1:
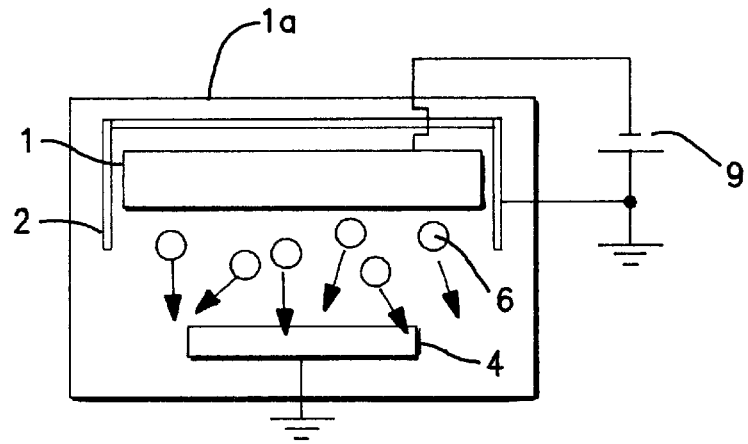
FIG. 1 is a cross sectional elevation view illustrative of the conventional parallel plate type sputtering apparatus.
Figure 2:
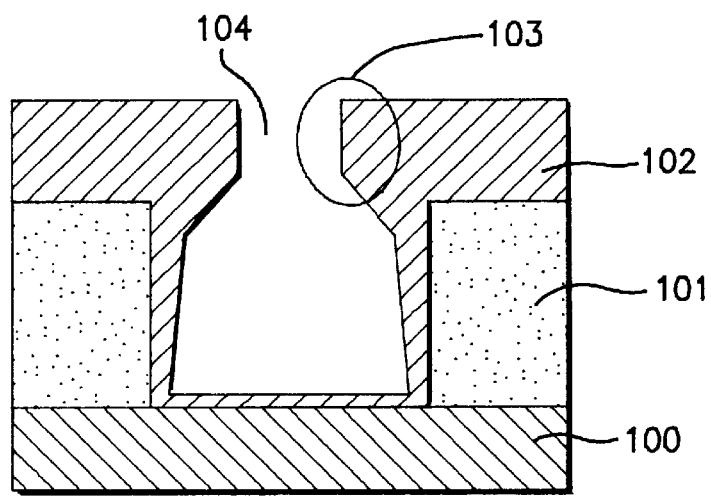
FIG. 2 is a fragmentary cross sectional elevation view illustrate of a conductive film with an overhanging portion at a contact hole step shoulder of a contact hole, which has been deposited by use of the conventional parallel plate type sputtering apparatus as illustrated in FIG. 1.
Figure 3:
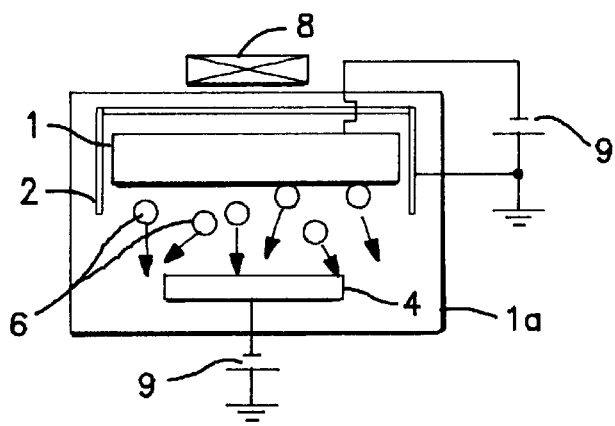
FIG. 3 is a cross sectional elevation view illustrative of the conventional bias sputtering apparatus.
Figure 4A:
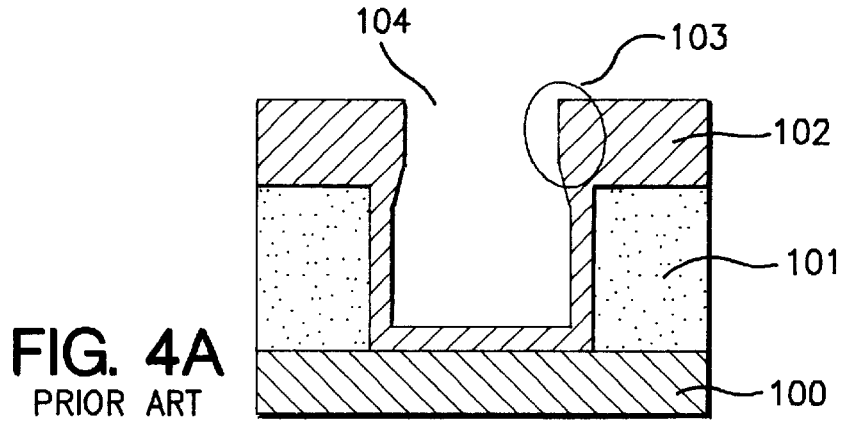
FIG. 4A is a fragmentary cross sectional elevation view illustrative of a conductive film with an overhanging portion at a contact hole step shoulder of a contact hole, which has been deposited by use of the conventional bias sputtering apparatus as illustrated in FIG. 3.
Figure 4B:
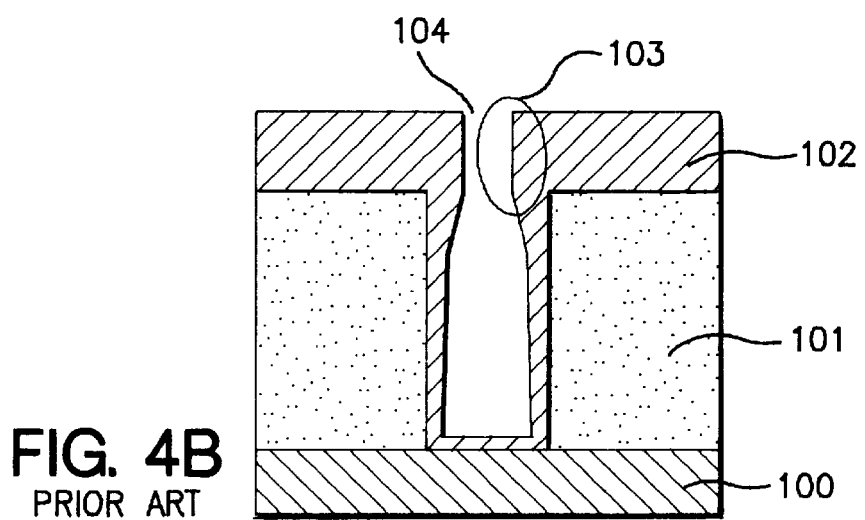
FIG. 4B is a fragmentary cross sectional elevation view illustrative of a conductive film with an overhanging portion at a contact hole step shoulder of a contact hole of a higher aspect ratio, which has been deposited by use of the conventional bias sputtering apparatus as illustrated in FIG. 3
Figure 5:
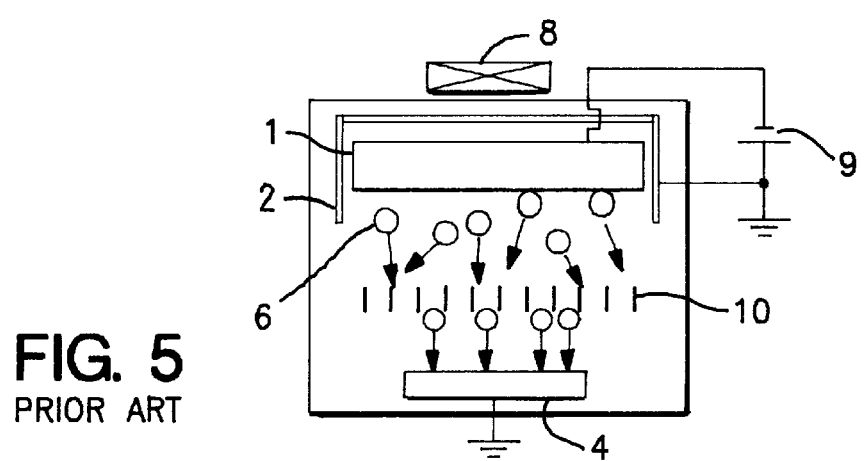
FIG. 5 is a cross sectional elevation view illustrative of the conventional collimator sputtering apparatus.
Figure 6A:
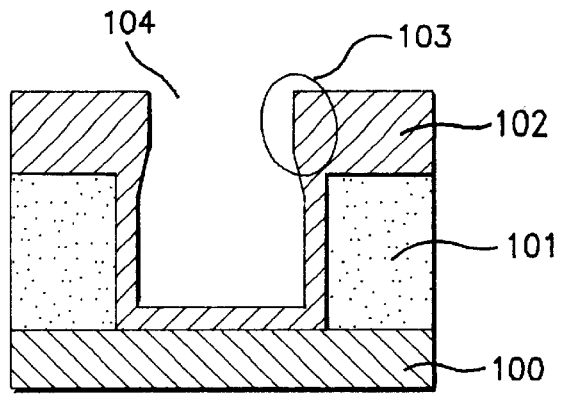
FIG. 6A is a fragmentary cross sectional elevation view illustrative of a conductive film with an overhanging portion at a contact hole step shoulder of a contact hole, which has been deposited by use of the conventional collimator sputtering apparatus as illustrated in FIG. 5.
Figure 6B:
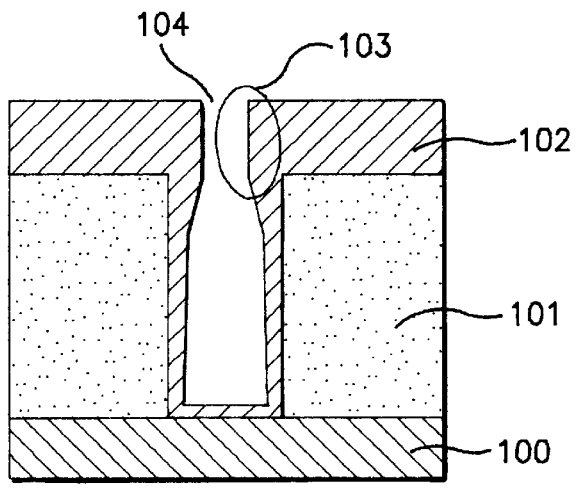
FIG. 6B is a fragmentary cross sectional elevation view illustrative of a conductive film with an overhanging portion at a contact hole step shoulder of a contact hole of a higher aspect ratio, which has been deposited by use of the conventional collimator sputtering apparatus as illustrated in FIG. 5.

The present invention provides a sputtering apparatus comprising a sputtering reaction chamber. A target is provided in the sputtering reaction chamber and is electrically grounded. A shielding plate is provided in the vicinity of the target and spaced from the target to be electrically isolated. A pulse signal generator is electrically connected between the target and the shielding plate for applying a pulse signal to the shielding plate to cause ionized sputter-particles and neutral sputter-particles to be emitted from the target and dropped at various angles into an under-space positioned under the target and in the sputtering reaction chamber. A substrate holder is provided in the sputtering reaction chamber. The substrate holder is laterally distanced from the under-space for holding a substrate so that a surface of the substrate is vertical. A static field generator is provided for generating a static field in a lateral direction to be applied across a laterally extending space which includes the substrate holder and the under-space so that the static field does laterally accelerate only the ionized sputter-particles toward the substrate held by the substrate holder for a lateral deposition of the ionized sputter-particles onto the surface of the substrate.

The static field generator may comprise an electrode plate having a surface vertical to the lateral direction, and a direct current power supply electrically connected to the electrode plate and to the substrate so as to apply a bias between the electrode plate and the substrate.

The electrode plate may electrically be grounded.

The pulse signal generator may be adopted to generate a rectangular pulse defined by alternating a positive voltage and a negative voltage, both of which are applied for times in the range of 10–100 msec.

The target may be made of one selected from the group consisting of refractory metals and refractory metal compounds.

Alternatively, the target may be made of one selected from the group consisting of aluminum and aluminum alloys.

Further alternatively, the target may be made of an insulation material and the sputtering apparatus further may comprise an irradiator for irradiating electrons onto the substrate for release of charges from the substrate.

The present invention also provides a sputtering apparatus comprising a sputtering reaction chamber. A target is provided in the sputtering reaction chamber. A shielding plate is provided in the vicinity of the target. An emitter is electrically connected to the shielding plate for causing ionized sputter-particles and neutral sputter-particles to be emitted from the target and dropped at various angles into an under-space positioned under the target and in the sputtering reaction chamber. A substrate holder is provided in the sputtering reaction chamber. The substrate holder is laterally distanced from the under-space for holding a substrate so that a surface of the substrate is vertical. A generator is provided for generating a static field in a lateral direction to be applied across a laterally extending space which includes the substrate holder and the under-space so that the static field does laterally accelerate only the ionized sputter-particles toward the substrate held by the substrate holder for a lateral deposition of the ionized sputter-particles onto the surface of the substrate.

The target may be electrically grounded. The shielding plate may also be spaced from the target to be electrically isolated. The emitter may comprise a pulse signal generator electrically connected between the target and the shielding plate for applying a pulse signal to the shielding plate.

The pulse signal generator may be adopted to generate a rectangular pulse defined by alternating a positive voltage and a negative voltage, both of which are applied for times in the range of 10–100 msec.

The generator may comprise an electrode plate having a surface vertical to the lateral direction, and a direct current power supply electrically connected to the electrode plate and to the substrate so as to apply a bias between the electrode plate and the substrate. In this case, the electrode plate may be electrically grounded.

The target may be made of one selected from the group consisting of refractory metals and refractory metal compounds.

Alternatively, the target may be made of one selected from the group consisting of aluminum and aluminum alloys.

Further alternatively, the target may be made of an insulation material and the sputtering apparatus may further comprise an irradiator for irradiating electrons onto the substrate for release of charges from the substrate.

The present invention also provides a sputtering apparatus comprising a sputtering reaction chamber. A target is provided in the sputtering reaction chamber. An emitter is electrically connected to the shielding plate for causing ionized sputter-particles and neutral sputter-particles to be emitted from the target in a first direction at various angles into a first space distanced from the target in the first direction and the first space being in the sputtering reaction chamber. A substrate holder is provided in the sputtering reaction chamber. The substrate holder is distanced from the first space in a second direction vertical to the first direction for holding a substrate so that a surface of the substrate is vertical to the second direction. A generator is provided for generating a static field in the second direction to be applied across a second space which includes the substrate holder and the first space so that the static field does accelerate in the second direction only the ionized sputter-particles toward the substrate held by the substrate holder for a deposition in the second direction of the ionized sputter-particles onto the surface of the substrate.

The target may be electrically grounded. The shielding plate may be spaced from the target to be electrically isolated. The emitter may comprise a shield plate provided in the vicinity of the target and a pulse signal generator electrically connected between the target and the shielding plate for applying a pulse signal to the shielding plate.

The pulse signal generator may be adopted to generate a rectangular pulse defined by alternating a positive voltage and a negative voltage, both of which are applied for times in the range of 10–100 msec.

The generator may comprise an electrode plate having a surface vertical to the second direction, and a direct current power supply electrically connected to the electrode plate and to the substrate so as to apply a bias between the electrode plate and the substrate. In this case, the electrode plate may be electrically grounded.

The target may be made of one selected from the group consisting of refractory metals and refractory metal compounds.

Alternatively, the target may be made of one selected from the group consisting of aluminum and aluminum alloys.

Further alternatively, the target may be made of an insulation material and the sputtering apparatus may further comprise an irradiator for irradiating electrons onto the substrate for release of charges from the substrate.

The present invention also provides a sputtering apparatus comprising a sputtering reaction chamber. A target is provided in the sputtering reaction chamber. An emitter is electrically connected to the shielding plate for causing ionized sputter-particles and neutral sputter-particles to be emitted from the target in a first direction at various angles into a first space distanced from the target in the first direction and the first space being in the sputtering reaction chamber. A substrate holder is provided in the sputtering reaction chamber. The substrate holder is placed in the first space for holding a substrate so that a surface of the substrate is vertical to the second direction. A generator is provided for generating a static field in the second direction to be applied across a second space which includes the first space so that the static field does accelerate in the second direction only the ionized sputter-particles toward the substrate held by the substrate holder for a deposition in the second direction of the ionized sputter-particles onto the surface of the substrate.

The target may be electrically grounded. The shielding plate may be spaced from the target to be electrically isolated. The emitter may comprise a shielding plate provided in the vicinity of the target and a pulse signal generator electrically connected between the target and the shielding plate for applying a pulse signal to the shielding plate.

The pulse signal generator may be adopted to generate a rectangular pulse defined by alternating a positive voltage and a negative voltage, both of which are applied for times in the range of 10–100 msec.

The generator may comprise an electrode plate having a surface vertical to the second direction, and a direct current power supply electrically connected to the electrode plate and to the substrate so as to apply a bias between the electrode plate and the substrate. In this case, the electrode plate may be electrically grounded.

The target may be made of one selected from the group consisting of refractory metals and refractory metal compounds.

Alternatively, the target may be made of one selected from the group consisting of aluminum and aluminum alloys.

Further alternatively, the target may be made of an insulation material and the sputtering apparatus may further comprise an irradiator for irradiating electrons onto the substrate for release of charges from the substrate.

A preferred embodiment according to the present invention will be described with reference to FIGS. 7, 8A, 8B, 9A and 9B, wherein a sputtering apparatus is provided, which is adopted for uniform deposition of a conductive film in a contact hole of very high aspect ratio without reduction in deposition rate or growth of the conductive film.

Figure 7:
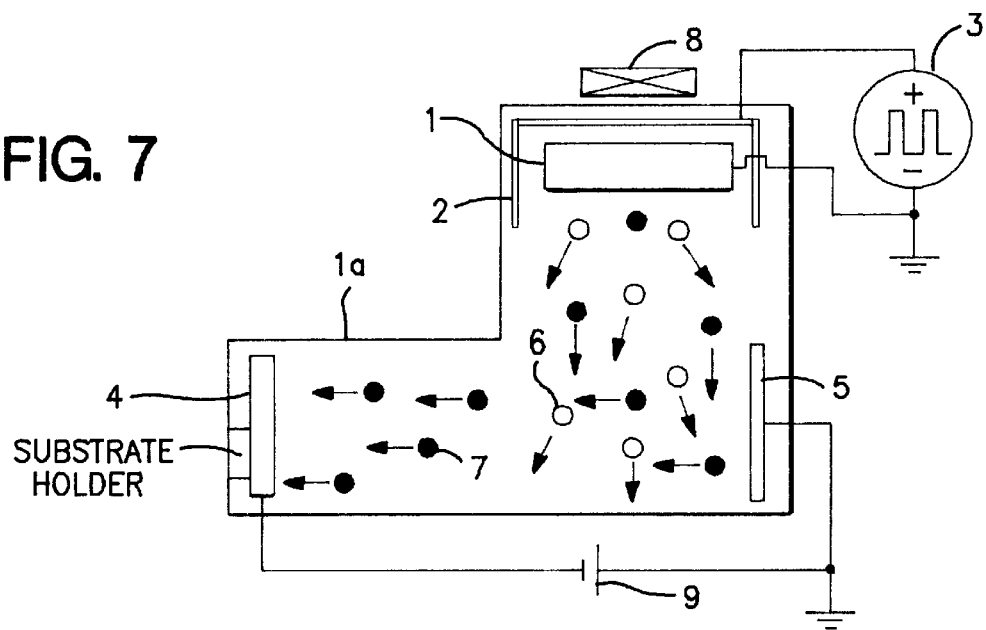
FIG. 7 is a cross sectional elevation view illustrative of a novel sputtering apparatus adopted for uniform deposition of a conductive film in a contact hole of very high aspect ratio without reduction in deposition rate or growth rate of the conductive film in a preferred embodiment according to the present invention.

With reference to FIG. 7, a sputtering apparatus is provided with a sputtering reaction chamber 1a and a target 1 in the sputtering reaction chamber 1a. The target 1 is electrically grounded. A shielding plate 2 is provided to surround the target 1 and spaced from the target 1 to be electrically isolated. A pulse signal generator 3 is electrically connected between the target 1 and the shielding plate 2 for applying a pulse signal to the shielding plate 2 to cause ionized sputter-particles 7 and neutral sputter-particles 6 to be emitted from the target 1 and dropped at various angles into an under-space positioned under the target 1 and in the sputtering reaction chamber 1a. The pulse signal generator may be adopted to generate a rectangular pulse defined by alternating a positive voltage and a negative voltage, both of which are applied for times in the range of 10–100 msec. The target 1 may be made of one selected from the group consisting of refractory metals and refractory metal compounds. Alternatively, the target 1 may be made of one selected from the group consisting of aluminum and aluminum alloys. Further alteratively, the target 1 may be made of an insulation material and the sputtering apparatus may further comprise an irradiator for irradiating electrons onto a substrate 4 for release of charges from the substrate 4. A substrate holder is provided in the sputtering reaction chamber 1a. The substrate holder is laterally distanced from the under-space for holding the substrate 4 so that a surface of the substrate 4 is vertical. An electrode plate 5 having a surface vertical to the lateral direction and a direct current power supply 9 is electrically connected to the electrode plate 5 and to the substrate 4 so as to apply a bias between the electrode plate 5 and the substrate 4. The electrode plate 5 and the direct current power supply 9 forms a static field generator which generates a static field in a lateral direction to be applied across a laterally extending space which includes the substrate holder and the under-space so that the static field does laterally accelerate only the ionized sputter-particles 7 toward the substrate 4 held by the substrate holder for a lateral deposition of the ionized sputter-particles 7 onto the surface of the substrate 4. The electrode plate 5 is electrically grounded. A magnet 8 is provided over a top wall of the sputtering reaction chamber 1a.

The ionized sputter-particles 7 are deposited at the right angle onto a surface of the substrate 4.

Figure 8A:
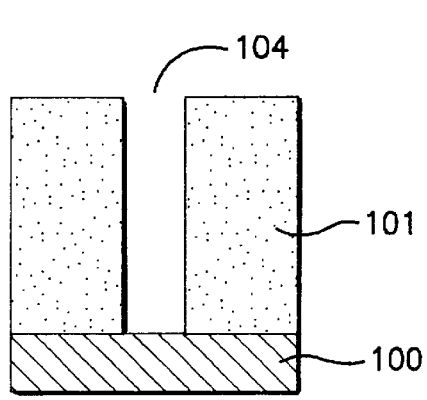
FIG. 8A is a fragmentary cross sectional elevation view illustrative of a contact hole formed in a silicon oxide film extending over a silicon substrate before a conductive film is formed by use of a novel sputtering apparatus illustrated in FIG. 7.

With reference to FIG. 8A, a silicon oxide film 101 having about 2 micrometers is deposited by a chemical vapor deposition method over the silicon substrate 100. A contact hole 104 having a diameter of 0.4 micrometers is formed in the silicon oxide film 101 by a photo-resist process and subsequent dry etching process. The contact hole 104 vertically extends to the top surface of the silicon substrate 100, for which reason the depth of the contact hole 104 is defined by the thickness of the silicon oxide film 101. The aspect ratio of the contact hole 104 is about 4. The substrate 100 is then placed in the sputtering reaction chamber 1a. The sputtering reaction chamber 1a is pumped to create a vacuum of 1.0 mTorr.

The pulse signal generator 3 of FIG. 7 generates a rectangular-shaped pulse waveform. The power of the pulse signal to be applied to the shield plate 2 is set to obtain a large amount of the generated ionized sputtering particles 7.

By way of reference, when the conventional sputtering method is carried out by using the collimators having an aspect ratio of 1:1, the growth rate of the film is about 18% of that when no collimator is used.

In the above present invention, ionized sputter-particles shears about 10% of the total amount of the sputtered particles from the target. Further, later-ionized particles in the plasma shears about 10% of the total amounts of the sputtered particles from the target. The sum of the ionized sputter-particles and the later-ionized particles in the plasma is about 20% of the total amount of the sputtered particles from the target. As a result, the growth rate of the conductive film is almost the same as that when the collimator is used.

As described above, the pulse signal generator 3 of FIG. 7 generates the rectangular-shaped pulse waveform defined by the positive and negative voltage levels. When the positive voltage of the pulse is applied to the shield 2, a plasma is generated whereby the neutral sputter-particles 6 and the ionized sputter-particles 7 are emitted from the target 1. The neutral sputter-particles 6 receive no force from the electric field and magnetic field and then move straight. By contrast, the ionized sputter-particles 7 are confined by a potential barrier due to a cathode potential drop. Contrary to the present invention, if the direct current voltage were applied to the shield plate 2, the ionized sputter-particles 7 are prevented from being emitted from the target 1. If, in accordance with the present invention as illustrated in FIG. 9A, the rectangular-shaped pulse signal defined by the positive and negative voltage levels are applied to the shield plate 2 and the voltage level is changed from the positive level to the negative level, then the above potential barrier due to the cathode potential drop disappears whereby the ionized sputter-particles 7 are allowed to be emitted from the target 1.

As described above and illustrated in FIG. 9B, the pulse signal generator is preferably adopted to generate a rectangular pulse defined by alternating a positive voltage and a negative voltage, both of which are applied for times T1 and T2 in the range of 10–100 msec. The times T1 and T2 are important factors for emissions of the ionized sputter-particles 7 and generation of the plasma. The times T1 and T2 are determined in consideration of the geometrical shape and arrangement of the target 1 and the shield plate 2 as well as a degree of the vacuum.

Figure 8B:
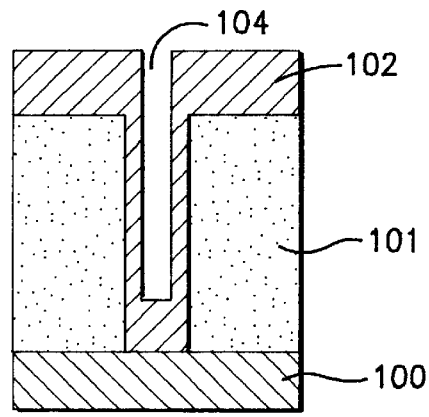
FIG. 8B is a fragmentary cross section elevation view illustrative of an overhanging free conductive film formed by use of a novel sputtering apparatus illustrated in FIG. 7 in a contact hole formed in a silicon oxide film extending over a silicon substrate in accordance with the present invention.
Figure 9B:
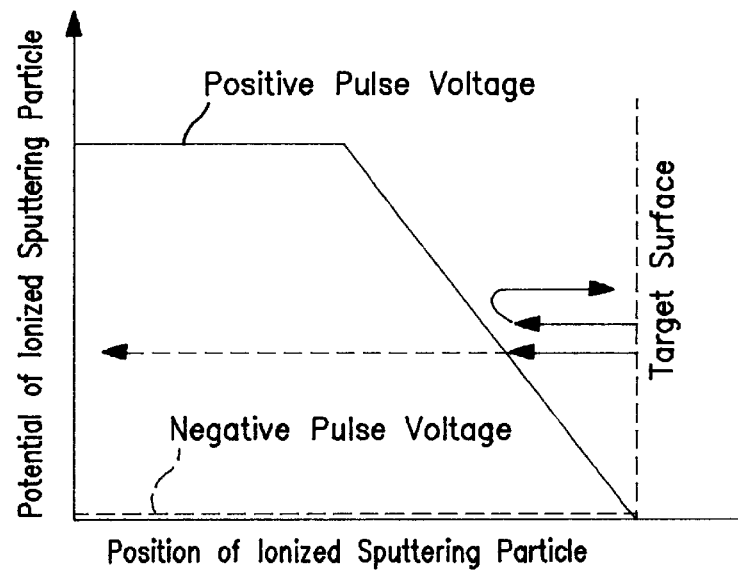
FIG. 9B is a diagram illustrative of waveform of pulse voltage signals to be applied between a target and a shield plate in a novel sputtering apparatus in accordance with the present invention.
Figure 9B:
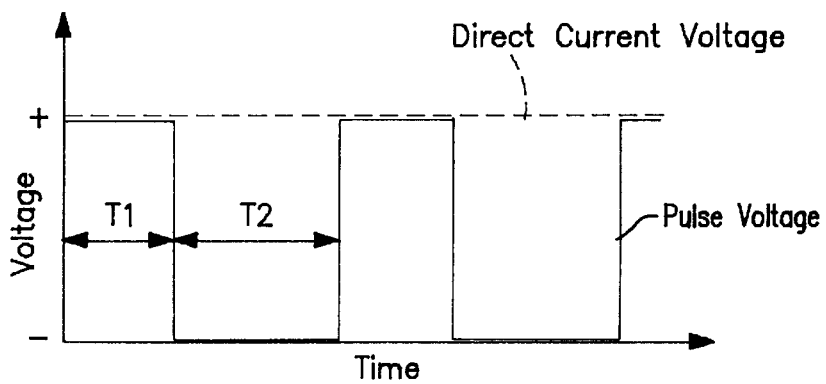

If the pulse signal at the negative voltage level is applied to the shield plate 2, then the ionized sputter-particles 7 more to the under-space between the electrode plate 5 and the substrate 4. The static electrical field is applied across the laterally extending space defined between the target 1 and the shield plate 2 so that the static field does laterally accelerate only the ionized sputter-particles 7 toward the substrate 4 held by the substrate holder for a lateral deposition of the ionized sputter-particles 7 onto the surface of the substrate 4 at the right angle. The electrode plate 5 is electrically grounded. A magnet 8 is provided over a top wall of the sputtering reaction chamber 1a. The growth rate of the conductive film 102 is controllable by controlling the potential difference between the target 1 and the shield plate 2. The lateral deposition of the ionized sputter-particles 7 onto the surface of the substrate 4 at the right angle forms a conductive film 102 free of any overgrowth at the contact hole step shoulder even the contact hole aspect ratio is high as illustrated in FIG. 8B. This results in no shadow effect as engaged with the conventional sputtering apparatus thereby obtaining a sufficient thickness of the under portion of the conductive film 102. This leads to a certain electrical connection within the contact hole with a high aspect ratio. If the above present invention is applied to the semiconductor integrated circuit, then it is possible to remarkably improve the reliability and the yield of the semiconductor integrated circuit.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A sputtering apparatus comprising:
   a sputtering reaction chamber;
   a target provided in the sputtering reaction chamber;
   a shielding plate provided in a vicinity of the target;
   a pulse signal generator electrically connected to the shielding plate and the target, the pulse signal generator being adapted to cause ionized sputter-particles and neutral sputter-particles to be emitted from the target;
   an electrode plate provided in the sputtering reaction chamber, the electrode plate being separate from the shielding plate;
   a substrate holder provided in the sputtering reaction chamber;
   a substrate held by the substrate holder so that the sputter-particles emitted from substantially all of the target cannot reach the substrate by traveling in a straight line, a sputter deposit surface of the substrate being parallel to and facing an exposed surface of the electrode plate, the substrate being positioned with respect to the electrode plate so that and imaginary line perpendicular to and passing through the sputter deposit surface of the substrate also passes through the electrode plate, all straight paths between the electrode plate and the substrate passing only through free space; and
   a DC power supply electrically connected to the electrode plate and the substrate, so as to generate a static electric field in a direction perpendicular to the sputter deposit surface of the substrate;
   wherein the ionized sputter-particles emitted from the target are directed toward the substrate by the static electric field.

2. The sputtering apparatus as claimed in claim 1, wherein said electrode plate is electrically grounded.

3. The sputtering apparatus as claimed in claim 1, wherein said pulse signal generator generates a rectangular pulse defined by alternating a positive voltage and a negative voltage, each of which is applied for times in the range of 10–100 msec.

4. The sputtering apparatus as claimed in claim 1, wherein said target is made of one selected from a group consisting of refractory metals and refractory metal compounds.

5. The sputtering apparatus as claimed in claim 1, wherein said target is made of one selected from a group consisting of aluminum and aluminum alloys.

6. The sputtering apparatus as claimed in claim 1, wherein said target is made of an insulation material and said sputtering apparatus further comprises an irradiator for irradiating electrons onto said substrate for release of charges from said substrate.

7. The sputtering apparatus as claimed in claim 1, wherein said shielding plate is spaced from said target to be electrically isolated.

8. The sputtering apparatus of claim 1, wherein the target is arranged between a plane described by the sputter deposit surface of the substrate and a plane described by the exposed surface of the electrode plate.

9. The sputtering apparatus of claim 1, wherein the target is electrically grounded.

10. The sputtering apparatus of claim 1, wherein the shielding plate is spaced from the target to be electrically isolated.

11. The sputtering apparatus of claim 8, wherein the target is electrically grounded.

12. The sputtering apparatus of claim 11, wherein the shielding plate is spaced from the target to be electrically isolated.

13. The sputtering apparatus as claimed in claim 12, wherein said electrode plate is electrically grounded.

14. The sputtering apparatus as claimed in claim 13, wherein said pulse signal generator generates a rectangular pulse defined by alternating a positive voltage and a negative voltage, each of which is applied for times in the range of 10–100 msec.

15. The sputtering apparatus as claimed in claim 14, wherein said target is made of one selected from a group consisting of refractory metals and refractory metal compounds.

16. The sputtering apparatus as claimed in claim 14, wherein said target is made of one selected from a group consisting of aluminum and aluminum alloys.

17. The sputtering apparatus as claimed in claim 14, wherein said target is made of an insulation material and said sputtering apparatus further comprises an irradiator for irradiating electrons onto said substrate for release of charges from said substrate.

18. The sputtering apparatus of claim 8, wherein the substrate and the electrode plate are positioned so that each of the emitted sputter-particles deposited on the substrate must intersect a respective imaginary line between the electrode plate and the substrate which is perpendicular to the sputter deposit surface of the substrate.

19. A sputtering apparatus comprising:

a sputtering reaction chamber;

a target provided in the sputtering reaction chamber;

a shielding plate provided in a vicinity of the target;

an emitter means electrically connected to the shielding plate for causing ionized sputter-particles and neutral sputter-particles to be emitted from the target;

an electrode plate provided in the sputtering reaction chamber, the electrode plate being separate from the shielding plate;

a substrate holder provided in the sputtering reaction chamber;

a substrate held by the substrate holder so that the sputter-particles emitted from substantially all of the target cannot reach the substrate by traveling in a straight line, a sputter deposit surface of the substrate being parallel to and facing an exposed surface of the electrode plate, the substrate being positioned with respect to the electrode plate so that an imaginary line perpendicular to and passing through the sputter deposit surface of the substrate also passes through the electrode plate, all straight paths between the electrode plate and the substrate passing only through free space; and a DC power supply electrically connected to the electrode plate and the substrate, so as to generate a static electric field in a direction perpendicular to the sputter deposit surface of the substrate;

wherein the ionized sputter-particles emitted from the target are directed toward the substrate by the static electric field.

20. The sputtering apparatus as claimed in claim 19, wherein said target is electrically grounded, said shielding plate being spaced from said target to be electrically isolated, and said emitter means comprises a pulse signal generator electrically connected between said target and said shielding plate for applying a pulse signal to said shielding plate.

21. The sputtering apparatus as claimed in claim 20, wherein said pulse signal generator generates a rectangular pulse defined by alternating a positive voltage and a negative voltage, both of which are applied for times in the range of 10–100 msec.

22. The sputtering apparatus as claimed in claim 19, wherein said electrode plate is electrically grounded.

23. The sputtering apparatus as claimed in claim 19, wherein said target is made of one selected from a group consisting of refractory metals and refractory metal compounds.

24. The sputtering apparatus as claimed in claim 19, wherein said target is made of one selected from a group consisting of aluminum and aluminum alloys.

25. The sputtering apparatus as claimed in claim 19, wherein said target is made of an insulation material and said sputtering apparatus further comprises an irradiator for irradiating electrons onto said substrate for release of charges from said substrate.

* * * * *